United States Patent
Tchoul et al.

(10) Patent No.: US 9,553,246 B2
(45) Date of Patent: Jan. 24, 2017

(54) SILICONE-GRAFTED CORE-SHELL PARTICLES, POLYMER MATRIX, AND LED CONTAINING SAME

(71) Applicants: Maxim N. Tchoul, Winchester, MA (US); Alan L. Lenef, Belmont, MA (US); David W. Johnston, Kensington, NH (US)

(72) Inventors: Maxim N. Tchoul, Winchester, MA (US); Alan L. Lenef, Belmont, MA (US); David W. Johnston, Kensington, NH (US)

(73) Assignee: OSRAM SYLVANIA Inc., Wilmington, MA (US)

( * ) Notice: Subject to any disclaimer, the term of this patent is extended or adjusted under 35 U.S.C. 154(b) by 0 days.

(21) Appl. No.: 15/204,467

(22) Filed: Jul. 7, 2016

(65) Prior Publication Data

US 2016/0322547 A1    Nov. 3, 2016

Related U.S. Application Data (62) Division of application No. 14/371,229, filed as application No. PCT/US2013/021548 on Jan. 15, 2013.

(60) Provisional application No. 61/586,968, filed on Jan. 16, 2012.

(51) Int. Cl.

| | |
|---|---|
| *H01L 33/56* | (2010.01) |
| *H01L 33/50* | (2010.01) |
| *C09K 11/02* | (2006.01) |
| *C08L 83/04* | (2006.01) |
| *C09K 5/14* | (2006.01) |

(52) U.S. Cl.
CPC .............. *H01L 33/56* (2013.01); *C08L 83/04* (2013.01); *C09K 5/14* (2013.01); *C09K 11/025* (2013.01); *H01L 33/507* (2013.01); *C08L 2203/206* (2013.01); *C08L 2205/025* (2013.01); *C08L 2207/53* (2013.01)

(58) Field of Classification Search
CPC ...... H01L 33/56; H01L 33/507; C09K 11/025; C09K 5/14; C08L 83/04; C08L 2203/206; C08L 2205/025; C08L 2207/53; Y10T 428/2982
USPC ....................................................... 428/405
See application file for complete search history.

(56) References Cited

U.S. PATENT DOCUMENTS

| | | |
|---|---|---|
| 5,824,739 A | 10/1998 | Kondo et al. |
| 2007/0221939 A1 | 9/2007 | Taskar et al. |
| 2009/0121180 A1 | 5/2009 | Tsubokawa et al. |
| 2010/0079988 A1 | 4/2010 | Johnston et al. |
| 2010/0178512 A1 | 7/2010 | Giesenberg et al. |
| 2011/0079988 A1* | 4/2011 | Bauer .................. B60R 21/233 280/728.1 |
| 2012/0153342 A1 | 6/2012 | Nishimura et al. |

FOREIGN PATENT DOCUMENTS

| | | |
|---|---|---|
| EP | 1 874 875 B1 | 8/2008 |
| EP | 2 060 537 A2 | 7/2015 |
| EP | 2 060 537 B1 | 7/2015 |
| JP | 7-323204 | 12/1995 |
| JP | 2009120437 | 6/2009 |
| WO | 2005059010 | 6/2005 |
| WO | 2005059010 A1 | 6/2005 |
| WO | 2008066154 | 6/2008 |
| WO | WO2008/068154 * | 6/2008 |
| WO | WO2009/078985 * | 6/2009 |
| WO | 2009078985 | 8/2009 |
| WO | 2010026992 A1 | 3/2010 |
| WO | 2011155482 A1 | 12/2011 |

OTHER PUBLICATIONS

Ying-Ling Liu et al. :Polydimethylsiloxane Star Polymers. Macromolecular: Rapid communications, vol. 25, Jan. 2004, pp. 1392-1395.*
Ying-Ling Lui et al., Poly(dimethyisiloxane) Star Polymers Having Nanosized Silica Cores, Macromolecular Rapid communications 25 (2004) 1392-1395.
Spherical Particles—Matyjaszewski Polymer Group—Carnegie Mellon University, http://www.cmu.edu/maty/materials/Nanostructured-materials/spherical-particles.html, printed from Internet Apr. 25, 2011.
Abstract WO/2005059010, KOSE Corp., Jun. 30, 2005.
Machine translation of specification of JP 4916174 B corresponding to WO 2005/059010, from JPO website (25 pp). Jun. 2005.
Machine translation of specification of JP 5555167B corresponding to WO 2010/026992, from JPO website (77 pp). Mar. 2010.

\* cited by examiner

*Primary Examiner* — Leszek Kiliman
(74) *Attorney, Agent, or Firm* — Edward S. Podszus (57) ABSTRACT

A silicone-grafted core-shell particle is described wherein the silicone-grafted core-shell particle comprises a core of an inorganic particle and a shell of a grafted poly(dimethylsiloxane) polymer formed from a bi-terminated poly(dimethylsiloxane) having reactive groups at each terminal end. The silicone-grafted core-shell particles may be dispersed in a polysiloxane polymer matrix and employed as an LED encapsulant.

2 Claims, 6 Drawing Sheets inorganic particle

SILICONE-GRAFTED CORE-SHELL PARTICLES, POLYMER MATRIX, AND LED CONTAINING SAME

CROSS-REFERENCE TO RELATED APPLICATION

This application is a divisional application of, and claims the benefit of, U.S. National Stage application Ser. No. 14/371,229 filed on Jul. 9, 2014, which claims the benefit of International Application No. PCT/US2013/021548, filed Jan. 15, 2013, which claims priority of U.S. Patent Application No. 61/586,968, filed Jan. 16, 2012, and entitled "SILICONE-GRAFTED CORE-SHELL PARTICLES, POLYMER MATRIX, AND LED CONTAINING SAME", the entire contents of which are hereby incorporated by reference.

TECHNICAL FIELD

This invention relates to silicone polymers and more particularly to silicone polymers used for light emitting diodes (LEDs).

BACKGROUND OF THE INVENTION

One of the standard designs of light emitting diodes utilizes a polymer material filled with fluorescent phosphor molded over the blue-light-emitting element (a so-called phosphor-conversion LED or pc-LED). Such design allows efficient mass production of LEDs with low variability in light emission. For this design, a mixture of fluorescent phosphor powders is used to achieve the required spectrum of light. For the polymer matrix, silicone is the first material of choice due to its high optical clarity, thermal stability, and easy processability. A significant drawback of the phosphor-filled polymer design is inefficient thermal transfer from the luminescent particles to the outside environment. Heat produced as a result of the conversion of the shorter-wavelength blue light into a longer-wavelength light, such as yellow light, must be efficiently removed; otherwise the increased operating temperature of the LED will result in reduced light efficacy and premature degradation of the luminescent material.

Heat transfer from the phosphor particles occurs through the layer of the surrounding polymeric matrix, which in general has poor thermal transfer properties. The thermal conductivity of silicones varies between 0.12 and 0.20 watts per meter Kelvin (W/mK) with the overall range for polymers being about 0.1-0.5 W/mK. The most thermally conductive polymeric materials are semicrystalline polymers, which are not suitable for LED encapsulation due to a high degree of light scattering from crystallites. Multiple solutions have been developed to increase thermal conductivity of polymers by the incorporation of metal or ceramic powders. However, due to a large size of the filler particles in conventional blends, such composites are not optically transparent.

Furthermore, in addition to thermal conductivity, the need for flame retardant optical grade polymers is increasing with the rapid expansion of light emitting diodes into the general lighting area. According to the ANSI/UL 8750 standard for LED lighting products, the enclosure (external parts) of the fixture must be designed in a way to ensure protection of the neighboring construction from fire that may result from ignition within the fixture. If polymers are used for the enclosure, a flammability rating of V-1 is required for the LED lenses and 5-VA for all other parts (ANSI/UL 94). Among the optical grade plastics on the market, only special flame retardant polycarbonates meet these criteria. Silicones offer a number of advantages compared to polycarbonates in terms of blending with phosphors and fabricating of components. Therefore, adding flame retardancy to the set of other properties will allow using silicones as encapsulants without having to build an additional protecting enclosure around the LED module.

Typically the flame retardancy of silicones may be improved by incorporation of various inorganic fillers, such as mica, titanium dioxide, carbon black, calcium carbonate, or diatomaceous earth. These fillers reduce the time to ignition as well as act as sources of char to insulate the combustion area from the adjacent areas of material. A significant drawback of the inorganic fillers is the loss of transparency resulting from their addition; therefore they only can be used in the products for which transparency is not important. Another possibility includes the use of salts of platinum and rhodium and oxides of rare earth metals. These additives can improve flame resistance to some extent without compromising transparency. However, their high cost discourages their use in large amounts.

Fumed silica is also known as a filler for silicones, primarily for increasing viscosity and tensile strength and for cost reduction. The surface of the silica particles is typically made hydrophobic by hexamethyldisilazane to improve compatibility with silicones. However, this approach does not provide sufficient compatibility as some loss of transmitted light is possible due to scattering from large aggregated particles.

It has been reported in the literature that star polymers comprised of silica nanoparticles grafted with monoglycidylether-terminated poly(dimethylsiloxane) (PDMS-G) showed enhanced thermal stability. Liu et al., *Poly(dimethylsiloxane) Star Polymers Having Nanosized Silica Cores*, Macromol. Rapid Commun., 25 (2004) 1392-1395. However, it was noted that steric hinderance limited the amount of PDMS-G that was capable of reacting with the silica surface. Moreover, the PDMS-G was terminated with a non-reactive n-butyl group, which would have the disadvantage of limiting crosslinking and densification of the polymer shell.

Thus, it would be an advantage to provide light transmissive silicone materials having increased thermal conductivity or fire retardancy for use with LEDs.

SUMMARY OF THE INVENTION

It is an object of the invention to obviate the disadvantages of the prior art.

It is another object of the invention to provide silicone polymers having an increased thermal conductivity or fire retardancy.

It is a further object of the invention to provide silicone polymers having optical properties sufficient for use with light emitting diodes (LEDs).

In one aspect of the invention, there are provided silicone-grafted core-shell particles having a core comprised on an inorganic particle and a shell comprised of a grafted poly(dimethylsiloxane) (PDMS). Preferably, the shell is formed from a bi-terminated PDMS in which each terminal end has a reactive functional group, e.g., —H or —OH. The inorganic core particles preferably have thermal conductivity of at least 1 W/mK and are preferably silica ($SiO_2$) nanoparticles with a preferred particle size of 10 to 200 nm. The end-functionalized PDMS polymer preferably has a molecular weight of 1,000 to 50,000 g/mol.

In another aspect of the invention, the silicone-grafted core-shell particles are dispersed in a polysiloxane polymeric matrix and applied as an encapsulant for LEDs. Preferably a luminophor such as a phosphor or quantum dot material is also dispersed in the polymeric matrix to convert some of the light emitted by the LED into light having a different wavelength. The dense polymeric shell of the silica-silicone hybrid particles also can minimize aggregation and keep the size of particles in the polymeric matrix small, even at very high content. A smaller particle size also may further reduce light scattering.

DETAILED DESCRIPTION OF THE INVENTION

For a better understanding of the present invention, together with other and further objects, advantages and capabilities thereof, reference is made to the following disclosure and appended claims taken in conjunction with the above-described drawings.

Figure 1:
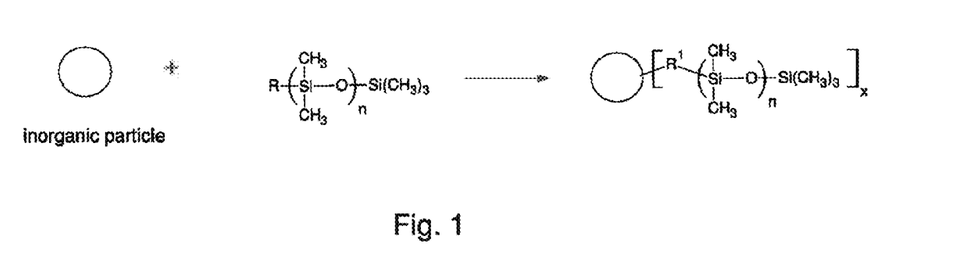
FIG. 1 illustrates a synthetic procedure for the preparation of silicone-grafted core-shell particles.

FIG. 1 illustrates a synthetic procedure for the preparation of the silicone-grafted core-shell particles and, in particular, poly(dimethyl siloxane) grafted core-shell particles. The circle represents an inorganic particle; R represents a functional end group reactive toward the surface of the particle (see Table 1); $R^1$ represents a product of reaction of the functional group R with the surface moieties of the particle; n is the degree of polymerization of the polymer; and x is the number of grafted chains per particle. Preferred materials for the core-shell particles include silicon dioxide (silica), titanium dioxide (titania), aluminum oxide (alumina), calcium carbonate, aluminum nitride, as well as other materials with a thermal conductivity of 1 W/mK and higher. Possible reactive end-functionalized groups are presented in Table 1. The groups react with the surface of particles resulting in a covalent or non-covalent bond. Depending on the ligand, the process may require a catalyst. The synthesis may or may not involve a solvent.

TABLE 1

Examples of the functional end groups

| Name of the group R | Structure of the group R |
|---|---|
| Epoxyalkyl: n = 1 . . . 10. Covalent addition; catalyst: salts of tin or titanium. |  |
| Hydroxy. Covalent addition; catalyst: salts of tin or titanium. | HO— |
| Trialcoxyalkyl: R, R' = methyl, ethyl; a = 1 . . . 3; b = (3 − a); n = 1 . . . 10. Covalent addition. | $(RO)_a R_b'C(CH_2)_n$— |
| Alkylphosphonic acid: n = 1-10. Covalent and non-covalent addition. |  |
| Alkylphosphonic acid, dialkyl ester: R = methyl, ethyl. Covalent and non-covalent addition. |  |
| Carboxylic acid. Covalent and non-covalent addition. | $HOOC—(CH_2)_n$— |
| Sulfide. Covalent and non-covalent addition. | HS— |
| Catechol: n = 1 . . . 10. Non-covalent addition. |  |

The thermal conductivity of a mixture of particles in polymer matrix follows the effective medium approximation. According to the Bruggeman model, the effective thermal conductivity of the composite is derived from the Equation 1, where $X_f$ is the volume fraction of the filler, and $k_f$, $k_m$, $k_c$ are thermal conductivity values for filler, matrix, and composite respectively.

$$\frac{k_c}{k_m} = \left(\frac{k_f - k_c}{k_f - k_m}\right) * \frac{1}{(1 - X_f)^3} \quad (1)$$

Figure 2:
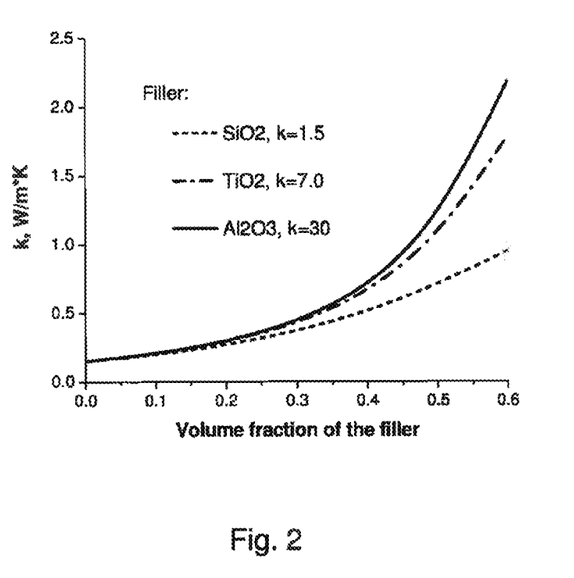
FIG. 2 is a graph of the calculated thermal conductivity of the composites having three different fillers.

FIG. 2 is a graph of the calculated thermal conductivity of the composites having three different fillers, silica ($SiO_2$), titania ($TiO_2$), and alumina ($Al_2O_3$), that are dispersed in a silicone matrix with a thermal conductivity of 0.15 W/mK. The values for thermal conductivity are given at the temperature of 300K.

A core-shell particle (also referred to as a hybrid particle) interacts with light as a particle with the "effective refractive index" that is a combination of the refractive indices of core and shell materials (Equation 2):

$$n_{c-s} = (n_c - n_s)\frac{r^3}{(r + h)^3} + n_s \quad (2)$$

Here, $n_{c-s}$, $n_c$, and $n_s$ are refractive indices of the core-shell particle, the material of the core and the shell respectively, r is the radius of the core and h is the thickness of the shell. When the overall particle size is much smaller than the wavelength of light and $n_{c-s}$ is equal to the refractive index of the polymer matrix, the incorporation of such particles into the matrix will result in a non-scattering transparent material.

Table 2 presents the calculated required core size for four different materials coated with a shell comprised of poly (dimethyl siloxane) with a refractive index of 1.395 and thickness of 5 nm and a matrix comprised of poly(diphenyl siloxane)-co-(dimethyl siloxane) copolymer with a refractive index of 1.460 or 1.537. The calculations are based on Equations (1) and (2). The size of core particles refers to the required particle diameter in order to have the effective refractive index of core-shell particles equal to that of the matrix. The highest volume fraction of filler refers to the volume fraction with no matrix polymer added.

ketone (MIBK), and 30 mg of $SnCl_2 \cdot 2H_2O$ was dissolved in the mixture. The mixture was transferred into a flask filled with nitrogen and 0.4 mL of a 0.5 g/mL MIBK solution of hydride-terminated poly(dimethyl siloxane)

(DMS-H21, 6,000 g/mol, obtained from Gelest, Inc.) was added dropwise. The flask was connected to a nitrogen gas

TABLE 2

Calculation for core size and volume fraction of transparent composites

| $n_{matrix}$ | $n_{shell}$ | thickness of shell, nm | Core material | $n_{core}$ | Size of core particles, nm | Highest volume fraction of filler, % | Thermal conductivity of the filler, W/mK | Thermal conductivity at the highest volume fraction, W/mK |
|---|---|---|---|---|---|---|---|---|
| 1.460 | 1.397 | 5.0 | $SiO_2$ | 1.532 | 34.5 | 46.6% | 1.5 | 0.63 |
| 1.537 | 1.397 | 5.0 | $TiO_2$ | 2.432 | 10.5 | 13.5% | 7.0 | 0.23 |
| 1.537 | 1.397 | 5.0 | AlN | 2.170 | 13.0 | 18.1% | 30.0 | 0.27 |
| 1.537 | 1.397 | 5.0 | $Al_2O_3$ | 1.755 | 27.1 | 39.0% | 30.0 | 0.65 |

In a preferred embodiment, the polysiloxane surface modifying agent has a formula:

wherein A, R, and B represent the following functional groups:
A: —OH, —H
B: —OH, —H, —CH=CH$_2$
R: —CH$_3$, —C$_2$H$_5$, —C$_6$H$_5$, —CH$_2$CH$_2$CF$_3$ The index n is the degree of polymerization of the polymer and x is the number of the grafted chains per particle. A and B represent reactive terminal groups at the terminal ends of the siloxane polymer chain. The grafting occurs via reaction of the surface hydroxyl groups of the particles with the reactive terminal groups of the polymer chains, e.g., hydride or silanol groups. The reaction may be catalyzed by salts of tin and the solvent may be any good solvent for polysiloxanes, such as toluene, xylene, ethylbenzene, methyl isobutyl ketone (MIBK), tetrahydrofurane (THF), chloroform, or methyl ethyl ketone. The bi-terminated poly(dimethyl siloxane) with reactive groups at both terminal ends is used to form the grafted particles in order to have the capability of cross-linking the grafted particles into elastomer networks.

Poly(Dimethyl Siloxane) Grafted Silica Particles

Example 1

Silica nanoparticles (MIBK-ST, 30 wt % dispersion in methyl isobutyl ketone, average size 20 nm, obtained from Nissan Chemicals) in the amount of 6 mL of dispersion (2 g of $SiO_2$) were diluted with 14 mL of methyl isobutyl line, immersed into an oil bath at 100° C., and the contents stirred for 2 hours under nitrogen protection, followed by slow addition of a further amount of the 0.5 g/mL MIBK solution of the hydride-terminated poly(dimethyl siloxane) intended to yield a desired fraction of silica in the final product. To obtain a product with a lower fraction of silica, 3.6 mL of the PDMS solution was used, resulting in a total of 2 g of the polymer added to the flask. To obtain a product with a higher fraction of the silica, 1.6 mL of the PDMS solution was used, resulting in a total of 1 g of the added polymer.

After stirring the contents for 40 hours, the flask was cooled to room temperature and the contents poured into 70 mL of methanol. A white precipitate formed which was separated by centrifugation at 5000 g for 40 minutes and then re-dissolved in 30 mL of toluene. The solution was sonicated in a bath for 5 min, filtered through a 0.45 um polypropylene syringe filter, and concentrated on a rotary evaporator to 5 mL. To the resulting solution, 70 mg of a cross-linking agent (1,3,5,7-tetravinyl-1,3,5,7-tetramethyl-cyclotetrasiloxane) and 40 µL of a 1 g/L THF solution of a platinum catalyst (platinum carbonyl cyclovinylmethylsiloxane complex) was added. The residual solvent was evaporated in vacuum at room temperature and the solid was allowed to cure for 24 h, yielding a transparent elastomer.

The composition of the samples was determined by analyzing the amount of carbon in the material, considering that poly(dimethyl siloxane) contains 32.4% carbon (by weight). The sample with the lower silica content contained 50% $SiO_2$ and 50% PDMS polymer by weight, while the sample with the higher silica content had 62% $SiO_2$ and 38% PDMS polymer by weight.

Figure 3:
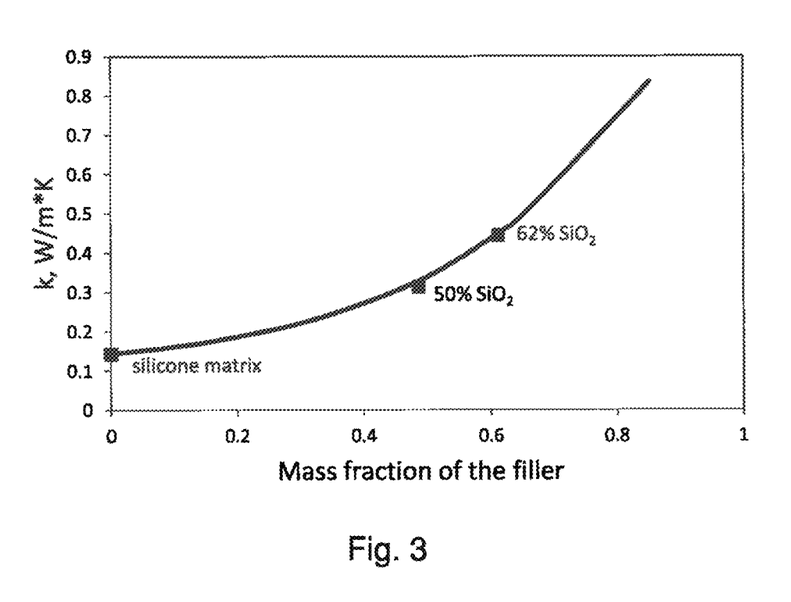
FIG. 3 is a graph of the experimental thermal conductivity values for both pure silicone and silica-silicone hybrid particles with 50% $SiO_2$ and 62% $SiO_2$ by weight.

FIG. 3 represents the experimental thermal conductivity values for both pure silicone and the silica-silicone hybrid particles with 50% $SiO_2$ and 62% $SiO_2$ by weight. The solid line represents the calculated values based on the Bruggeman effective media model. The best fit to the experimental data was enabled considering that thermal conductivity of the individual colloidal silica nanoparticles is 1.2 W/mK. The mass fraction is used instead of volume fraction.

Example 2

Silica nanoparticles (MIBK-ST, 30 wt % dispersion in methyl isobutyl ketone, average size 20 nm, obtained from Nissan Chemicals) in the amount of 6 mL of dispersion (2 g of $SiO_2$) were diluted with 14 mL of methyl isobutyl ketone (MIBK), and 30 mg of $SnCl_2.2H_2O$ was dissolved in the mixture. The mixture was transferred into a flask filled with nitrogen and 0.4 mL of a 0.5 g/mL MIBK solution of silanol-terminated poly(dimethyl siloxane)

(DMS-S31, 26,000 g/mol, obtained from Gelest) was added dropwise. The flask was connected to a nitrogen gas line, immersed into an oil bath at 100° C., and the contents stirred for 2 h under nitrogen protection, followed by slow addition of 3.6 mL of the 0.5 g/mL MIBK solution of the silanol-terminated poly(dimethyl siloxane), resulting in a total of 2 g of the polymer added to the flask. After stirring the contents for 40 h the flask was cooled to room temperature and the contents poured into 70 mL of methanol. The white precipitate was separated by centrifugation at 5000 g for 40 min and re-dissolved in 30 mL of toluene. The solution was sonicated in a bath for 5 min, filtered through a 0.45 um polypropylene syringe filter, and concentrated on a rotary evaporator to 5 mL. The residual solvent was evaporated in vacuum at room temperature and the solid was allowed to cure for 24 h, yielding a transparent elastomer.

Figure 4:
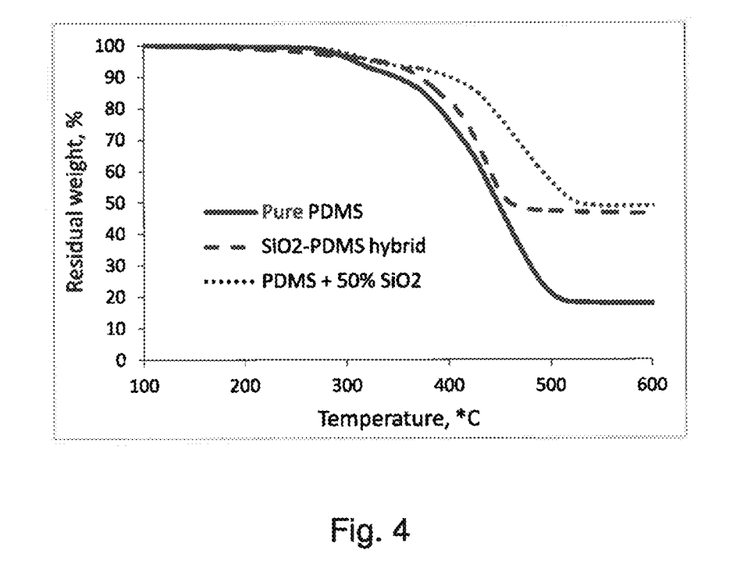
FIGS. 4 and 6 show thermogravimetric analyses in air of $SiO_2$-PDMS hybrids (dashed line), along with pure PDMS (solid line), and PDMS+50% $SiO_2$ (dotted line).
Figure 5:
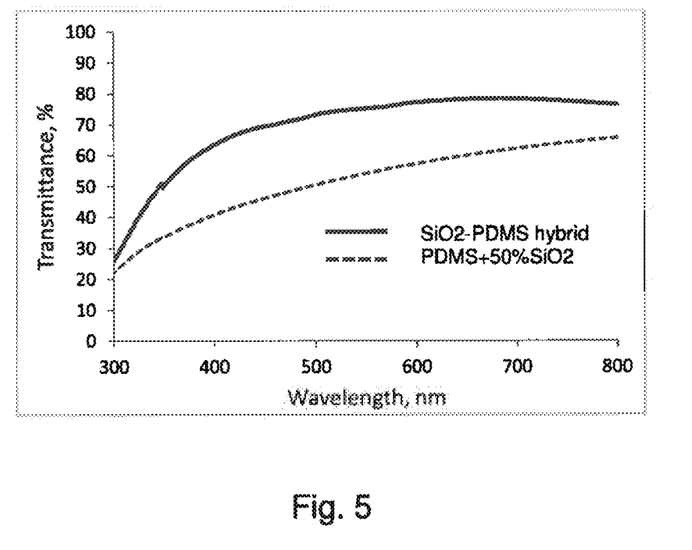
FIGS. 5 and 7 are graphical comparisons of the transmission of light through 1 mm cast films of $SiO_2$-PDMS hybrids and PDMS+50% $SiO_2$.

The synthesized material ("$SiO_2$-PDMS hybrid") was compared to the pure poly(dimethyl siloxane) ("pure PDMS") and poly(dimethyl siloxane) blended with amorphous silica in the ratio of 1:1 by weight (further: "PDMS+50% $SiO_2$"). FIG. 4 presents a thermogravimetric analysis in air of the $SiO_2$-PDMS hybrid (dashed line), along with pure PDMS (solid line), and PDMS+50% $SiO_2$ (dotted line). FIG. 5 compares the transmission of light through 1 mm cast films of $SiO_2$-PDMS hybrid and PDMS+50% $SiO_2$. The transmittance of the $SiO_2$-PDMS hybrid is significantly higher compared to PDMS+50% $SiO_2$ prepared by mechanical blending, due to the minimized aggregation of the silicon dioxide particles in $SiO_2$-PDMS provided by chemical modification of the particles surface.

Example 3

Silica nanoparticles (MIBK-ST, 30 wt % dispersion in methyl isobutyl ketone, average size 20 nm, obtained from Nissan Chemicals) in the amount of 6 mL of dispersion (2 g of $SiO_2$) were diluted with 14 mL of methyl isobutyl ketone (MIBK), and 30 mg of $SnCl_2.2H_2O$ was dissolved in the mixture. The mixture was transferred into a flask filled with nitrogen and 0.4 mL of a 0.5 g/mL MIBK solution of hydride-terminated poly(dimethyl siloxane) (DMS-H21, 6,000 g/mol, obtained from Gelest) was added dropwise. The flask was connected to a nitrogen gas line, immersed into an oil bath at 100° C., and the contents stirred for 2 h under nitrogen protection, followed by slow addition of 3.6 mL of the 0.5 g/mL MIBK solution of the hydride-terminated poly(dimethyl siloxane), resulting in a total of 2 g of the polymer added to the flask. After stirring the contents for 40 h the flask was cooled to room temperature and the contents poured into 70 mL of methanol. The white precipitate was separated by centrifugation at 5000 g for 40 min and re-dissolved in 30 mL of toluene. The solution was sonicated in a bath for 5 min, filtered through a 0.45 um polypropylene syringe filter, and concentrated on a rotary evaporator to 5 mL. To the resulting solution, 70 mg of a cross-linking agent (1,3,5,7-tetravinyl-1,3,5,7-tetramethylcyclotetrasiloxane) and 40 μL of 1 g/L THF solution of a platinum catalyst (platinum carbonyl cyclovinylmethylsiloxane complex) was added. The residual solvent was evaporated in vacuum at room temperature and the solid was allowed to cure for 24 h, yielding a transparent elastomer.

Figure 6:
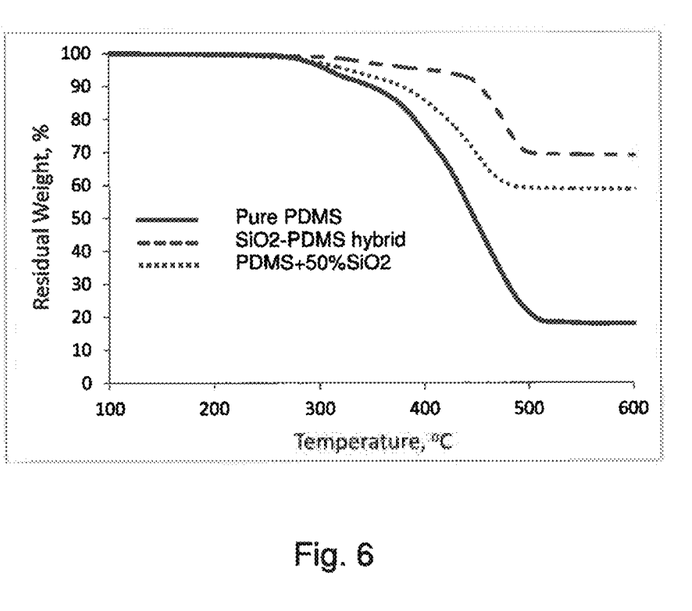
Figure 7:
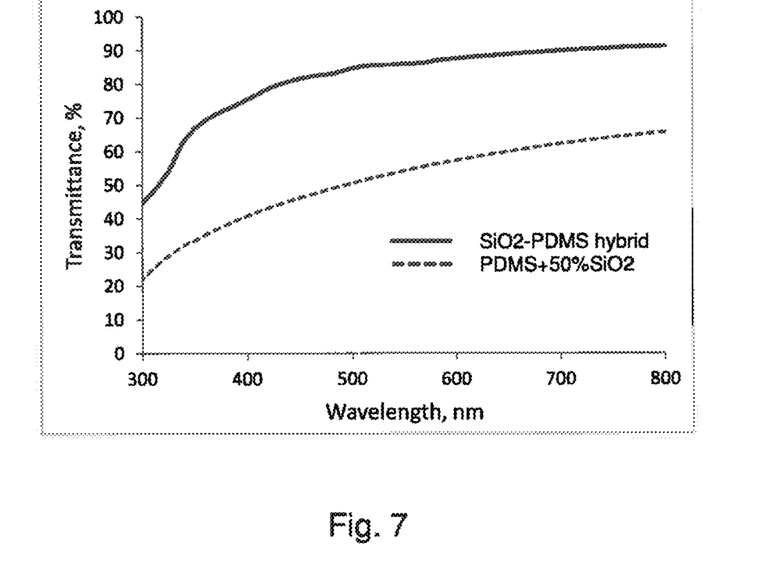

FIG. 6 presents a thermogravimetric analysis in air of the resulting $SiO_2$-PDMS hybrid (dashed line), along with pure PDMS (solid line), and PDMS+50% $SiO_2$ (dotted line). FIG. 7 shows the transmission of light through 1 mm cast films of $SiO_2$-PDMS hybrid and PDMS+50% $SiO_2$. A significant improvement in optical transmittance of the hybrid material over the mechanical blend can be observed, which is attributed to the minimized aggregation of particles.

Figure 8:
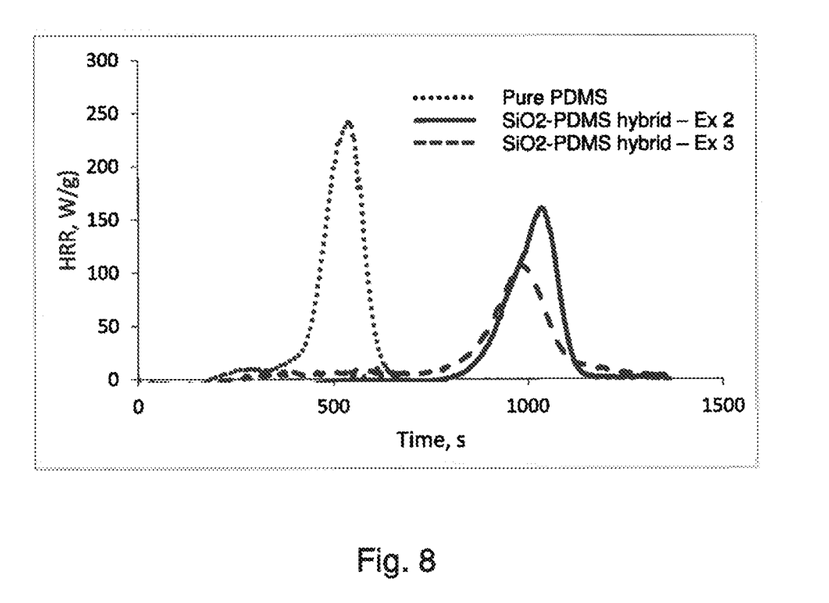
FIG. 8 shows heat release rates, as measured by combustion microcalorimetry, for $SiO_2$-PDMS hybrids compared to PDMS alone.
Figure 9:
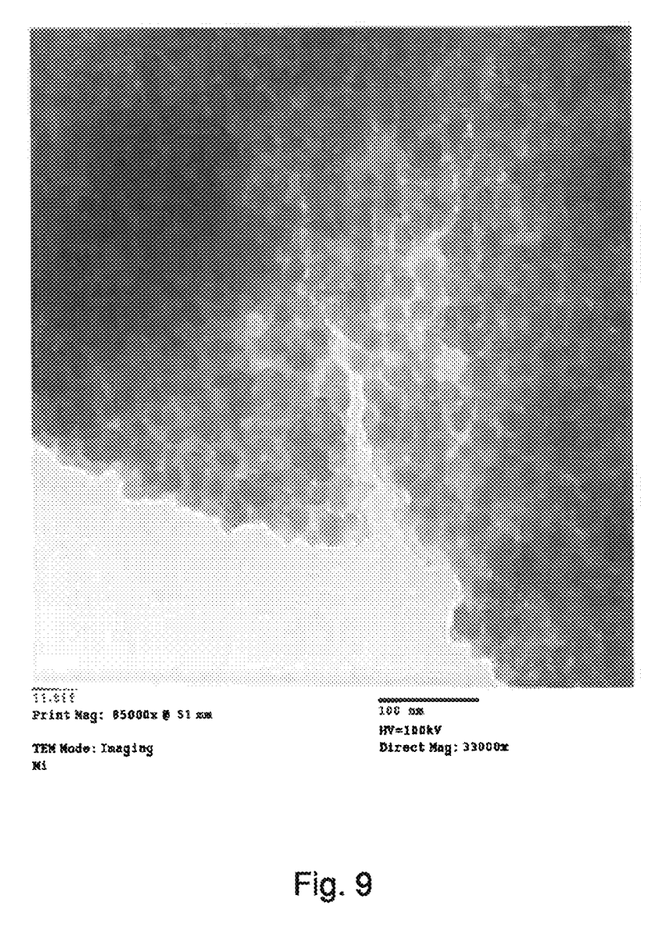
FIG. 9 is a transmission electron micrograph of a $SiO_2$-PDMS.

FIG. 8 shows the heat release rates, as measured by combustion microcalorimetry, for the $SiO_2$-PDMS hybrids prepared in Examples 2 and 3 compared to a sample of PDMS (no silica). Each sample was heated in air from 75° C. to 750° C. at the rate of 1° C. per second. The peak on the plot indicates the burning process. A significant delay in the ignition and burning of $SiO_2$-PDMS hybrid materials compared to the unfilled PDMS indicates a greater flame resistance for the $SiO_2$-PDMS hybrid materials. The much lower heat release rates further indicate a lower flammability for the $SiO_2$-PDMS hybrid materials. FIG. 9 is a transmission electron micrograph of the $SiO_2$-PDMS hybrid material of Example 3.

Figure 10:
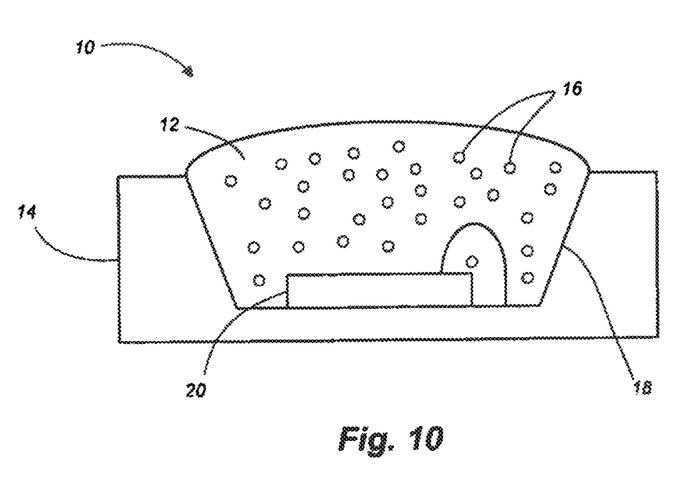
FIG. 10 is a schematic illustration of an LED with a silica-containing polymer encapsulant according to this invention.

FIG. 10 is an illustration of an LED package 10 wherein the LED die 20 is mounted in a carrier 14 having reflective sides 18. The LED die 20 is encapsulated in a polymeric matrix 12 which contains a dispersion of silicone-grafted core-shell particles. The matrix 12 further contains particles of a luminophor 16, e.g., a phosphor or quantum dot material.

While there have been shown and described what are at present considered to be preferred embodiments of the invention, it will be apparent to those skilled in the art that various changes and modifications can be made herein without departing from the scope of the invention as defined by the appended claims.

It is claimed:

1. An LED comprising an LED die encapsulated in a polymeric matrix comprising a plurality of silicone-grafted core-shell particles dispersed in a polysiloxane polymer.

2. The LED of claim 1 wherein the polymeric matrix further contains a luminophor.

* * * * *